310-369 SR
XR 3,432,773
X89579

March 11, 1969 C. E. LAND ETAL 3,432,773

EMITTER-FOLLOWER OSCILLATOR EMPLOYING FERROELECTRIC CERAMIC FEEDBACK NETWORK

Filed Aug. 15, 1967

INVENTORS
Cecil E. Land
Donald G. Schueler
BY
Roland A. Anderson
Attorney

3432773
OR IN 331/116R

INVENTORS
Cecil E. Land
Donald G. Schueler
BY
Roland A. Anderson
Attorney

United States Patent Office 3,432,773
Patented Mar. 11, 1969

3,432,773
EMITTER-FOLLOWER OSCILLATOR EMPLOYING FERROELECTRIC CERAMIC FEEDBACK NETWORK

Cecil E. Land and Donald G. Schueler, Albuquerque, N. Mex., assignors to the United States of America as represented by the United States Atomic Energy Commission Filed Aug. 15, 1967, Ser. No. 661,179
U.S. Cl. 331—116 8 Claims
Int. Cl. H03b 5/30

ABSTRACT OF THE DISCLOSURE

A transistor oscillator with ferroelectric ceramic multiterminal feedback network whereby the transistor is connected as an emitter-follower amplifier, and the feedback network is connected between the base and emitter electrodes of the transistor. The feedback network includes an axially polarized ferroelectric ceramic resonator with input, output and base electrodes, where the input and output electrodes are connected respectively to the emitter and base electrode of the transistor and the base electrode of the resonator is returned to ground. A modulator electrode can be included to permit modulation of the oscillator at either of two stable states of oscillation, where such stable states of oscillation are controlled by the direction of electrical polarization under the input and output electrodes.

BACKGROUND OF INVENTION

Transistors have inherently unstable gain characteristics under conditions of varying temperature. For this reason they are not well adapted for use as the active element in an oscillator circuit unless they are coupled with special temperature compensation circuits. Without such compensation, the instability of the transistor results in corresponding frequency instability of the oscillator.

It is possible to eliminate some of the undesirable consequences of the temperature sensitivity of transistors by operating in the emitter-follower configuration in which gain becomes less than unity. However, if it is desired to use the emitter-follower circuit in an oscillator in order to sustain oscillation, it becomes necessary to apply a passive network with a voltage gain equal to or greater than unity. Such passive networks are available, for example, transformers with tuned circuits, crystal resonators, and so forth. All of these passive networks, however, require some adjustable element for frequency control, such as a capacitor. Consequently, there are limitations on the simplicity and degree of miniaturization possible. One of the chief advantages of transistorized circuitry is its adaptability to the integrated microcircuit techniques. A problem therefore facing the prior art becomes that of selecting a combination of active and passive network for a transistorized oscillator which is compatible with microcircuit or hybrid microcircuit construction.

SUMMARY OF INVENTION

The oscillator of this invention makes use of a ferroelectric ceramic which is preferably hot pressed under suitable condi ions of temperature and pressure. The hot pressed ferroelectric ceramic is cut in segments of the required size and precision ground into rods having the desired contour of the finished device. The rods are sliced to obtain bars or disks for specific applications. Further cleaning and polishing is required before vacuum deposition of electrodes on the major surfaces of the ceramic. This provides a ferroelectric ceramic resonator for employment in the feedback network of the oscillator of this invention.

The ferroelectric ceramic resonator can be independently polarized under each of two, or in some cases three, electrodes when the resonator is used as a feedback network in an oscillator. The state of polarization under the electrodes provides the oscillator with either of two stable states of oscillation. Trimming the oscillator frequency can be accomplished by varying the amplitude of electrical polarization under either of the electrodes.

The ferroelectric ceramic resonator can be built in a variety of configurations depending upon the acoustical vibrational mode used to achieve frequency selectivity. There are a number of common resonator vibrational modes. The fluxural or bending mode, e.g., the "oil can" effect in a disk is, in general, a low frequency mode. Resonators employing this mode include the bar or disk, tuning fork, multimorph (multilayer) split ring or cantilever beam. The longitudinal expander mode is characterized by vibration along the length dimension of a long thin bar. Contour extensional vibrational modes are characterized by contour vibrations of thin plates, e.g., the radial extensional mode of a disk. The common resonator configurations employing contour extensional modes are thin disks or rectangular plates. Still another vibrational mode is the thickness expander mode characterized by vibrations along the thickness dimension of a plate. When the ferroelectric ceramic resonator is employed in the oscillator feedback network, the operating frequency determines the resonator configuration and physical dimensions to be used.

It is therefore an object of this invention to provide a transistor oscillator which can be constructed in the form of a hybrid microcircuit.

It is another object of this invention to provide a transistor oscillator having a passive feedback network with greater than unity voltage gain.

It is a further object of this invention to provide a transistor oscillator having a resonant circuit whose frequency may be adjusted electrically from an external source.

It is another object of this invention to provide a transistor oscillator having a passive feedback network in which all lumped circuit components are eliminated.

It is a further object of this invention to provide a transistor oscillator in which either of two stable states of oscillation may be achieved by means external to the circuit.

It is another object of this invention to provide a transistor oscillator in which the amplitude of the oscillator output signal can be modulated by means external to the circuit.

This invention comprises an active network and a passive feedback network connected in parallel to provide an oscillator, the active network including a transistor connected as an emitter-follower amplifier, the transistor having collector, emitter, and base electrodes, biasing means for the transistor, the passive feedback network consisting of a flat plate multiterminal ferroelectric ceramic resonator connected between the base and emitter electrodes of the transistor.

DESCRIPTION OF DRAWINGS

Embodiments of the present invention are shown in the accompanying drawings wherein.

DETAILED DESCRIPTION

Figure 1:
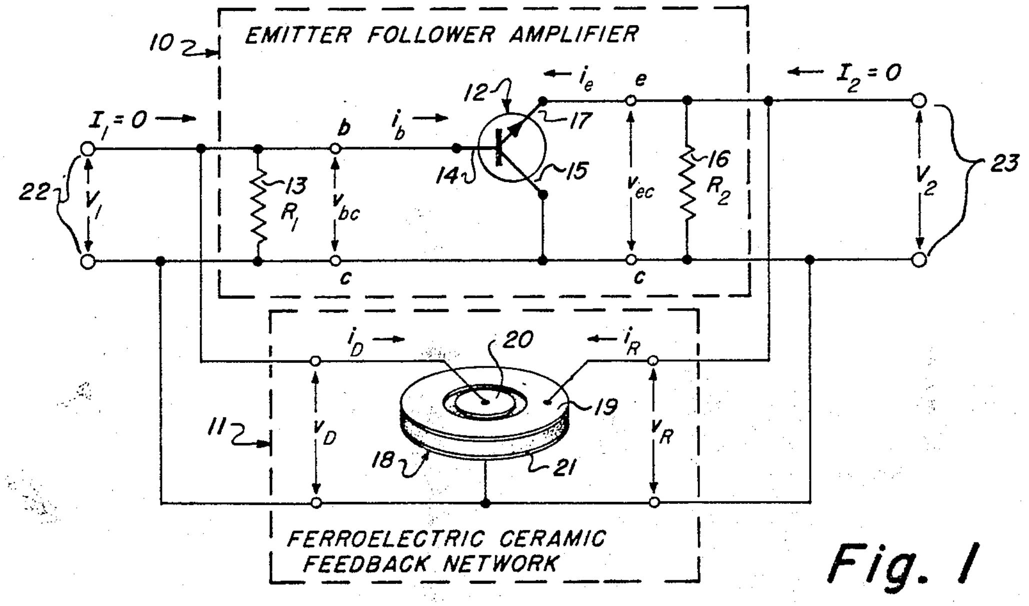
FIG. 1 is a schematic diagram of the transistor oscillator with a two-terminal pair ferroelectric ceramic resonant disk feedback network.

Referring to FIG. 1, the transistor feedback oscillator of this invention consists of a transistor emitter-follower amplifier 10 shown in dotted lines together with a ferroelectric ceramic feedback network 11 also shown in dotted lines. Transistor emitter-follower amplifier 10, and ferro electric ceramic resonant disk feedback network 11 are connected in parallel configuration. Amplifier 10 includes transistor 12, biasing resistor 13 ($R_1$), connected between base electrode 14 and collector electrode 15, and output load resistor 16 ($R_2$), which is connected between emitter electrode 17 and collector electrode 15. Network 11 includes ferroelectric disk 18 having ring electrode 19 and dot electrode 20 on one major surface, and single, common, or base electrode 21 which covers the opposite major surface. Ring electrode 19 and dot electrode 20 are the input and output electrodes, respectively, of ferroelectric ceramic resonant disk 18 and of feedback network 11 and together form a so-called two-terminal pair in which base electrode 21 is common to each pair. The two-terminal pair network comprising the transistor feedback oscillator is open-circuited at both input and output terminal pairs 22 and 23, respectively.

*Criteria for oscillation*

From the schematic of FIG. 1, and the equivalent circuit of FIG. 2, the oscillator circuit operation can be described as follows:

According to well-known two-terminal pair network theory, the following linear relationships exist between the network currents and voltages;

$$I_1=Y_{11}V_1+Y_{12}V_2$$
$$I_2=Y_{21}V_1+V_{22}V_2$$

where $I_1$ and $I_2$ are the currents at the input and output terminal pairs 22 and 23, respectively;

$V_1$ and $V_2$ are the voltages across input and output terminal pairs 22 and 23, respectively;

$Y_{11}$ is the driving point admittance at input terminals 22, that is, the admittance at the input terminal pair with the output terminal pair 23 short-circuited; given by $$Y_{11}=\frac{\partial I_1}{\partial V_1}\bigg|V_2=0$$

$Y_{12}$ is the input-to-output transfer admittance; given by $$Y_{12}=\frac{\partial I_1}{\partial V_2}\bigg|V_1=0$$

$Y_{21}$ is the output-to-input tranfer admittance; given by $$Y_{21}=\frac{\partial I_1}{\partial V_1}\bigg|V_1=0$$

and $Y_{22}$ is the driving point admittance at terminal pair 23, which is the admittance at the output terminal pair with the input terminal pair short-circuited, given by $$Y_{22}=\frac{\partial I_2}{\partial V_1}\bigg|V_1=0$$

When the circuit is oscillating, the currents at the two open-circuited terminal pairs, $I_1$ and $I_2$, are both zero; while the voltages at the two-terminal pairs, $V_1$ and $V_2$, are not zero; therefore, the above relationships become;

$$0=Y_{11}V_1+Y_{12}V_2$$
$$0=Y_{21}V_1+Y_{22}V_3$$

According to a theory of linear algebra, non-trivial solutions of the above pair of equations can exist only when the determinant formed by the network admittance is equal to zero;

$$\begin{vmatrix} Y_{11} & Y_{12} \\ Y_{21} & Y_{22} \end{vmatrix}$$

The criteria which must be satisfied to obtain oscillation of the circuit of FIG. 1 is, therefore, that the determinant of the two-terminal pair network admittances must be equal to zero.

Figure 2:
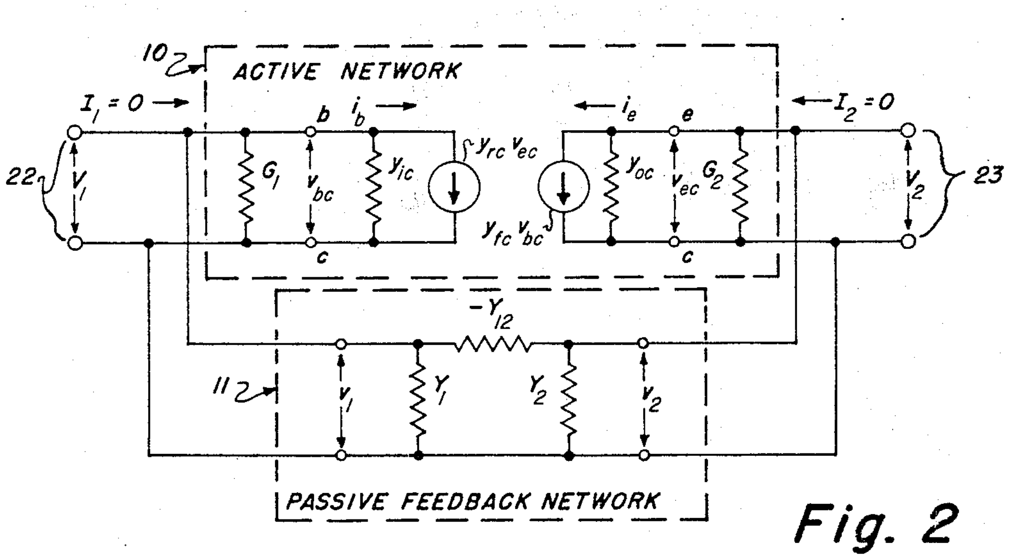
FIG. 2 is an equivalent circuit diagram of the transistor feedback oscillator of FIG. 1.

From the equivalent circuit of FIG. 2, the following relationships are obtained;

$$V_1=v_{bc}=v_1$$
$$V_2=v_{ec}=v_2$$

In this equation, $v_{bc}$ is the small signal voltage impressed between base electrode 14 and collector electrode 15 of transistor 12. $v_{ec}$ is the small signal voltage appearing between emitter electrode 17 and collector electrode 15 of transistor 12. $v_1$ shown across admittance $Y_1$ of the pi network in the equivalent circuit of FIG. 2 is the signal voltage between dot electrode 20 and base electrode 21 of ceramic resonator 18 and is shown as $v_D$ in FIG. 1. $v_2$ shown across the admittance $Y_2$ of the pi network in the equivalent circuit of FIG. 2 is the signal voltage between ring electrode 19 and base electrode 21 of ceramic resonator 18 and is shown in FIG. 1 as $v_R$. The two-terminal pair admittance of the amplifier 10, which is referred to as the active network, is given by $$Y_{11A}=G_1+y_{ic}$$
$$Y_{12A}=-y_{rc}$$
$$Y_{21A}=-y_{fc}$$
$$Y_{22A}=G_2+y_{oc}$$

In these equations the subscript A designates the active network $G_1$ is the conductance of biasing resistor 13 ($R_1$) given by $G_1=1/R_1$ and $G_2$ is the conductance of output resistor 16 ($R_2$) given by $G_2=1/R_2$;

$y_{ic}$ is the small signal input driving point admittance of the amplifier 10 as indicated in FIG. 2; $y_{rc}$ is the input-to-output transfer admittance of the amplifier 10 shown in parallel with $y_{ic}$; $y_{fc}$ is the output-to-input transfer admittance of the amplifier 10; and $y_{oc}$ is the output driving point admittance of the amplifier 10 and in parallel with $y_{fc}$.

The two-terminal pair admittances of the ferroelectric ceramic feedback network 11 (i.e., the passive feedback network), are given in terms of its pi network circuit by;

$$Y_{11F}=Y_1+Y_{12}$$
$$Y_{12F}=Y_{21F}=-Y_{12}$$
$$Y_{22F}=Y_2+Y_{12}$$

The subscript F designates the passive feedback network.

Since the feedback oscillator consists of the active and passive feedback network connected in parallel, the two-terminal pair admittances of the oscillator circuit are simply the sums of the corresponding two-terminal pair admittances of the active network and the passive feedback network;

$$Y_{11}=Y_{11A}+Y_{11F}=G_1+y_{ic}+y_{rc}+Y_1+Y_{12}$$
$$Y_{12}=Y_{12A}+Y_{12F}=-(y_{rc}+Y_{12})$$
$$Y_{21}=Y_{21A}+Y_{21F}=-(y_{fc}+Y_{12})$$
$$Y_{22}=Y_{22A}+Y_{22F}=G_2+y_{oc}+y_{fc}+Y_2+Y_{12}$$

From the condition that the determinant of the oscillator two-terminal pair network admittances must equal zero in order to obtain oscillation, the following relationship is obtained:

$$Y_{11}Y_{22}-Y_{12}Y_{21}=0$$

or from the above relationships;

$$(G_1+y_{1c}+y_{rc}+Y_1+Y_{12})\cdot(G_2+y_{oc}+y_{fc}+Y_2+Y_{12})-(y_{rc}+Y_{12})(y_{fc}Y_{12})=0$$

The above equations completely define the relationships which must exist between the individual circuit elements to obtain oscillation. Similar analytical techniques can easily be employed to describe the oscillation criteria for so-called three-terminal pair electrodes such as shown below in FIGS. 4 and 5b.

Figure 3:
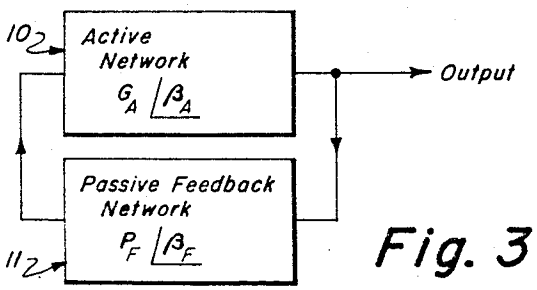
FIG. 3 is a simplified block diagram of the transistor feedback oscillator of FIG. 1.

The criteria for oscillation can be stated in another way with reference to the block diagram of FIG. 3. The transistor emitter-follower amplifier 10 is shown as the active network with a power gain of $G_A$ and phase shift of $\beta_A$; the ferroelectric ceramic resonant network is shown as passive feedback network 11 with power loss $P_F$ and phase shift $\beta_F$. The well-known Barkhausen criteria for oscillation are given by;

$$G_AP_F=1$$
$$\beta_A+\beta_F=0$$

This means that for stable oscillation to occur, the closed loop power gain must be unity and the voltage (or current) phase shift around the closed loop must equal zero. Interpreted in terms of voltages, these criteria become;

$$(G_{vA})(G_{vF}=1$$
$$\beta_{vA}+\beta_{vF}=0$$

The product of the closed loop voltage gain $G_{vA}$ of the active network 10 and the voltage transformation ratio of the passive feedback network 11, $G_{vF}$ must equal unity to sustain stable oscillation. Similarly, the sum of the voltage phase shifts $\beta_{vA}$ of active network 10 and $\beta_{vF}$ of the passive feedback network 11 must equal zero. By definition, the voltage gain of a transistor emitter-follower amplifier is less than unity. The voltage transformation ratio ($v_1/v_2$ of FIG. 2) of the passive feedback network must, therefore, exceed unity to satisfy the oscillation criteria. If the feedback network voltage transformation ratio is less than unity, the circuit cannot oscillate. In this case it behaves as an active filter with an effective quality factor ($Q_{eff}$) given by the product of the power gain of the active network ($G_A$) and the quality factor of ferroelectric ceramic resonant feedback network (Q);

$$Q_{eff}=G_AQ$$

The voltage transformation ratio of the resonant network is determined in the main by the relative cross-sectional areas of the input and output electrodes, the spacing between these electrodes and the location of such spacing in relation to the surface of the element on which these electrodes are placed. For disk-type resonators such as shown in FIG. 1, as a general rule, the cross-sectional area of the input electrode should be greater than that of the output electrode in order to obtain a voltage transformation ratio greater than unity.

The voltage transformation ratio is also affected to a lesser degree by the magnitude and direction of the ferroelectric axial polarization at each electrode. In general, decreasing the magnitude of ferroelectric polarization at either or both electrodes decreases the voltage transformation ratio. Switching the direction of ferroelectric axial polarization at either the input or output electrodes changes the phase shift $\beta_F$ by 180°. For resonant disk 18, shown in FIG. 1, the criteria for oscillation at the fundamental radial extensional resonant mode of the disk are satisfied if the ferroelectric polarization is in the same direction at ring electrode 19 and dot electrode 20. If the ferroelectric axial polarization direction is different for the two electrodes, the oscillation criteria are satisfied at only the first overtone resonance which is near the third harmonic of the fundamental radial resonance.

Consider now as an illustration the ferroelectric ceramic feedback network 11 of FIG. 1 which may use, for example, a contour extensional resonator. The contour extensional (planar) resonant frequencies of a thin disk are given by the following equations:

$$f_n=\frac{v_1K_n}{2\pi a}$$

where $f_n$ is the frequency of mode $n$ ($n=1, 2, 3 \ldots$), $a$ is the radius of the disk, $v_1$ is the planar longitudinal velocity of sound in the thin disk, and $K_n$ is the set of normalized characteristic value frequencies associated with the thin disk. The planar sound velocity is given by $$v_1=(\rho s_p)^{-1/2}$$

where $\rho$ is the density of the ceramic and $s_p$ is the planar elastic compliance for a thin disk. The normalized characteristic value frequencies are given by $$(1-\sigma)J_1(K_n)=K_nJ_0(K_n)$$

where $\sigma$ is Poisson's ratio for the ceramic, $J_0$ and $J_1$ are the zeroth and first order Bessel functions, respectively. From the above equations it can be seen that the disk resonant frequencies, hence, the oscillator frequencies, depend upon both the material, properties and the radius of the disk. For a given material, fundamental resonant frequencies in the range 50 kHz. to 3 mHz. can be obtained by varying the disk radius. If the ceramic under the dot and ring electrodes is oppositely polarized so that the oscillator operates at the first overtone, frequencies between 150 kHz. and 9 mHz. can be obtained by varying the disk radius.

Figure 4:
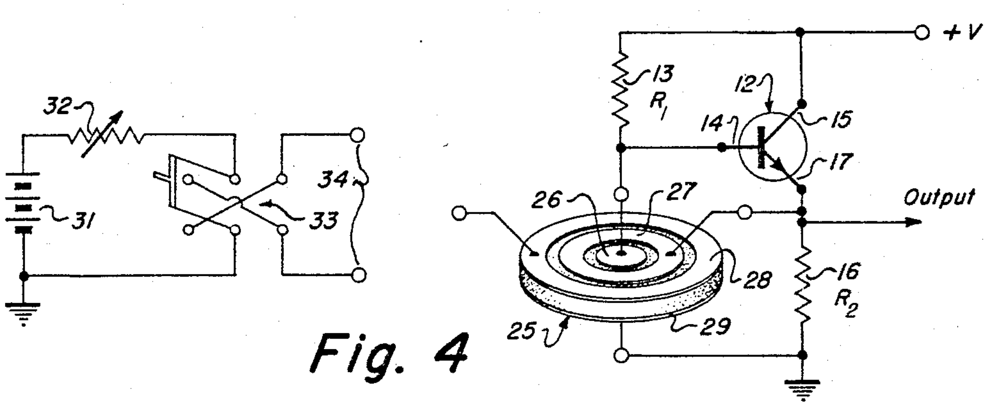
FIG. 4 is a schematic diagram of the transistor oscillator with a three-terminal pair ferroelectric ceramic disk feedback network.

Another embodiment of the feedback oscillator is shown in FIG. 4. This circuit is the same as the one shown in FIG. 1 with the exception that a three-terminal pair ferroelectric ceramic resonant disk 25 is used for the feedback network. The three-terminal pair resonant disk 25 includes dot electrode 26, first ring electrode 27 and second ring electrode 28 on one surface and common base electrode 29 covering the opposite surface. Second or outer ring electrode 28 may be used as a modulator electrode. The oscillator can be amplitude modulated by varying the amplitude of the ceramic polarization under the modulation electrode 28 or by varying the electrical termination between the modulation electrode 28 and base electrode 29. The oscillator frequency is little affected by the amplitude modulation. Battery 31, variable resistor 32 and double-pole double-throw switch 33 are included in a simple schematic for switching the electrical polarization of ferroelectric ceramic disk 25. Switching the axial polarization is accomplished by connecting terminals 34 between dot electrode 26 and base electrode 29 or between first ring electrode 27 and base electrode 29 and applying the voltage of battery 31. The switching of electrical polarization can be done between either pair of electrodes. If it is desirable to operate the oscillator at the fundamental disk resonant frequency, the polarization under dot electrode 26 and first ring electrode 27 is similar. If it is desirable to operate the oscillator at the first overtone, then either the axial polarization under the dot electrode 26 or first ring electrode 27 is oppositely polarized. Once the desired operating frequency has been established, the switching circuit is removed. However, there may be applications where it is desirable to switch the oscillator back and forth between its two stable states of oscillation; for example, in telemetry In this type of application the switching of polarization can be accomplished by well-known electronic switching.

This same switching circuit is employed when it is desired to trim the oscillator at some predetermined frequency. Terminals 34 can be connected between either the dot and base electrode or between the first ring and base electrode and the amplitude of the voltage controlled by variable resistor 32. Once the oscillator has been trimmed, the switching circuit is removed. The switching circuit described in connection with the three-terminal pair feedback network can be employed with the two-terminal pair feedback network of FIG. 1.

This capability of electrically adjusting the final operating frequency provided by the ferroelectric properties of the feedback element makes this type of feedback element particularly applicable to hybrid microcircuits. The reason for this is that the adjustment of the physical dimensions of the feedback element are not required to obtain the final operating frequency.

As in connection with the disk described in FIG. 1, the relative size and spacing of the input and output electrodes is important in the establishment of a voltage transformation ratio greater than unity. For oscillators operating at the fundamental frequency of a three-terminal pair resonator, such as in FIG. 4, the area of the input electrode should again exceed that of the output electrode for a voltage transformation ratio greater than unity.

While it is understood that the circuit specifications of the feedback oscillator system of the present invention may vary according to the desired design for any particular application, the following circuit specifications for the circuit of FIG. 4, to provide a nominal oscillation frequency of 686,000 Hz., are included by way of example only:

Transistor 12—Type 2N2891
Supply voltage V—+15 volts
Resistor 13—560,000 ohms
Resistor 16—6,800 ohms
Ceramic disk feedback network 25—Lead zirconate-lead titanate ceramic with 65% lead zirconate and 35% lead titanate containing 2 atom percent bismuth oxide. The material was hot pressed at 1300° C. for one hour at 3000 p.s.i The disk is 0.076 mm. thick and 3.81 mm. outside diameter. Dot electrode 26 is 1.41 mm. diameter; inside ring electrode 27 is 1.56 mm. inside diameter and 2.14 mm. outside diameter; and outside ring 28 inside diameter is 2.29 mm. The spacing between electrodes is 0.015 mm.

Figure 5A:
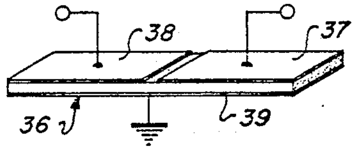
FIGS. 5*a* and 5*b* illustrates a two-terminal pair and a three-terminal pair long thin bar ferroelectric ceramic resonators, respectively.

A further modification of the feedback oscillator shown in FIG. 1 is obtained by replacing two-terminal pair ferroelectric ceramic resonant disk 18 by a two-terminal pair long thin bar 36 as shown in FIG. 5*a*. For the purposes of this application, a long thin bar is defined as one in which the following relationships hold between length, *l*, width, *w*, and thickness, *t*; namely, $$\frac{l}{w} \geqq \sqrt{10}$$

and $$\frac{w}{t} \geqq \sqrt{10}$$

Rectangular electrode 37 is connected to the emitter electrode 17; rectangular electrode 38 is connected to base electrode 14; and base electrode 39 is connected to collector electrode 15 through the transistor power supply.

Figure 5B:
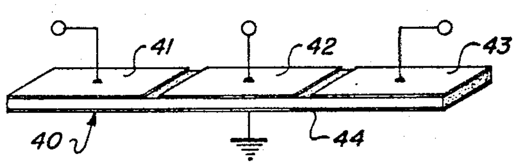

Another modification of the feedback oscillator circuit of FIG. 4 is obtained by replacing the three-terminal pair ferroelectric ceramic resonant disk 25 with a three-terminal pair long thin bar 40 as shown in FIG. 5*b*. Where rectangular electrode 41 is connected to base electrode 14, rectangular electrode 42 is connected to emitter electrode 17, rectangular electrode 43 is the modulation electrode and base electrode 44 is connected to ground.

Feedback oscillators employing ferroelectric ceramic thin bar feedback networks such as those shown in FIGS. 5*a* and 5*b* operate at the longitudinal expander resonance of the thin bar. Oscillator frequencies in the range of 30 kHz. to 10 mHz. are obtained with these feedback network configurations. Typical circuit specifications for the circuit of FIG. 4 with the long thin bar resonator 40 of FIG. 5*b* substituted for the disk resonator 25 are as follows:

Oscillator frequency—220,000 Hz.
Transistor—Type 2N2891
Resistor 13—560,000 ohms
Resistor 16—6,800 ohms
Power supply V—+15 volts
Long Thin Bar Resonator 40—Lear zirconate-lead titanate ceramic wi.h 65% lead circonate and 35% lead titanate containing two atom percent bismuth oxide. The material was hot pressed at 1300° C. for one hour at 3000 p.s.i. The bar dimensions are: length, 8.13 mm.; width, 1.27 mm.; thickness, 0.15 mm. Electrodes were each 2.54 mm. long by 1.27 mm. wide. The spacing between electrodes was 0.254 mm.

In any two- or three-terminal pair resonator as described for use in the circuit of this invention, whether in the form of a disk or a long thin bar, if after the device is electroded and tested it develops that less than unity voltage transformation ratio is being achieved, a simple reversal of the input and output electrode leads will rectify the problem. This would involve, for example in FIG. 1, a connection of electrode 19 to transistor base 14 and a connection of dot electrode 20 to transistor emitter 17. A similar reversal could be effected to solve a similar problem in connection with the circuit of FIG. 4.

Under an optional construction of the embodiment of FIG. 4, dot electrode 26 becomes the modulator electrode and the ring electrodes 27 and 28 become the output and input electrodes, respectively, with appropriate connections to the transistor 12. In such case dot electrode 26 will ordinarily have a larger cross-sectional area than either ring electrode 27 or ring electrode 28.

Figure 6A:
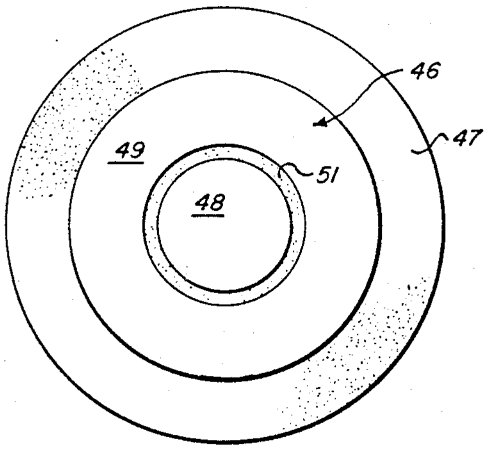
FIGS. 6*a* and 6*b* show a top view and a cross-sectional view, respectively, of a bimorph flexural mode resonator.
Figure 6B:
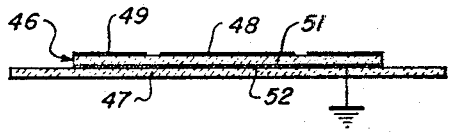

A further modification of the feedback oscillator circuit of this invention is obtained by replacing the two-terminal pair ferroelectric disk resonant feedback network of FIG. 1 with a two-terminal pair ferroelectric ceramic flexural mode resonator. An oscillator employing the flexural mode feedback network can be made to operate in the frequency range of 1 kHz. to 100 kHz. An example of a two-terminal pair flexural mode resonator is shown in FIGS. 6*a* and 6*b*. A ferroelectric ceramic resonant disk 46, normally adapted to vibrate in the contour extensional mode, is bonded to plate 47. Plate 47 may be any material that will flex with the vibrations of the resonator. In operation plate 47 constrains the disk 46 to vibrate in the flexural mode. In the low frequencies, the vibrations of the plate 47 will be audible. In the cross-sectional view of FIG. 6*b* dot electrode 48 and ring electrode 49 are vapor deposited on the top surface of ceramic 51 and base electrode 52 is deposited on the under surface with the combination bonded to plate 47.

The available literature contains adequate explanation of the theoretical basis for the inherent ability of the ferroelectric resonator to produce a voltage transformation ratio greater than 1 and it is deemed unnecessary in this application to set forth the mathematical calculations for determination of an optimum relationship between electrode cross-sectional areas together with the extent and positioning of the spacing between them.

Also described in the literature are the considerations which dictate the optimum relation of the modulator electrode to that of the input and output electrodes. See, in particular, Land, C. E., Small Signal Applications of Monolithic Multiport Piezoelectric Devices, IEEE WESCON Convention Record, paper 3–5, distributed publicly Aug. 22, 1966.

To recapitulate, the oscillator circuit of this invention is a combination of a transistor emitter-follower circuit and a ferroelectric ceramic resonator employed as an oscillator feedback network. It circumvents the inherent voltage gain instability with temperature of the transistor and takes particular advantage of the greater than unity voltage gain characteristic of the ferroelectric ceramic resonator. It takes further advantage of the fact that the ceramic resonator can be designed to operate in a number of different vibrational modes yielding a corresponding number of distinct frequency ranges. It is well adapted to employment in hybrid microcircuitry because of its freedom from frequency adjustment features. Other embodiments than those described will be obvious to those skilled in the art without departing from the scope of the invention as expressed in the above description and in the appended claims.

What is claimed is:

1. An oscillator comprising:
a transistor having emitter, collector and base electrodes and connected as an emitter-follower amplifier,
biasing means for said transistor,
means for providing a low impedance output connected between the emitter electrode and ground,
a feedback network connected between the base and emitter electrodes, said feedback network including an axially polarized ferroelectric ceramic plate resonator having an input electrode and an output electrode on one major surface of said resonator, said input and output electrodes being connected respectively to the emitter and base electrodes of said transistor, said resonator also having a base electrode on the opposite major surface thereof and connected to ground.

2. An oscillator as in claim 1 wherein said resonator consists of a long thin bar and wherein said input and output electrodes have a rectangular configuration of predetermined cross-sectional areas spacing on the one major surface and wherein said base electrode is substantially coextensive with the opposite major surface.

3. An oscillator as in claim 1 including means for trimming the frequency of oscillation comprising an external source of variable potential which may be momentarily applied across said resonator in an axial direction between the two major surfaces thereof, whereby the amplitude of electrical polarization across preselected portions of said resonator may be varied.

4. An oscillator as in claim 1 including means for reversing the electrical polarization across a predetermined portion of said disk while maintaining the polarization constant across the remainder of said disk, whereby the frequency of said oscillator may be changed to another stable state.

5. An oscillator as in claim 1 including a modulator electrode affixed to the one major surface of said resonator and means for varying the polarization under said modulation electrode, whereby the amplitude of the output of said oscillator may be modulated.

6. An oscillator as in claim 1 including a modulator electrode affixed to the one major surface thereof and means for varying the electrical impedance between said modulator electrode and ground, whereby the amplitude of the output of said oscillator may be modulated.

7. An oscillator as in claim 1 wherein said ceramic resonator consisting of a circular disk wherein said input and output electrodes have the configuration of concentric rings of predetermined cross-sectional area and spacing on said one major surface and wherein said base electrode is substantially coextensive with the opposite major surface of the disk.

8. An oscillator as in claim 7 wherein a flat plate is bonded to and substantially coextensive with one of the major surfaces of said disk, said plate being capable of flexural vibration, whereby the combination of the disk and the plate are constrained to oscillate in a flexural mode.

No references cited.

JOHN KOMINSKI, *Primary Examiner.*

U.S. Cl. X.R.

331—108, 163, 182, 154; 332—31, 52; 333—71; 310—9.6